United States Patent
Dono

(10) Patent No.: US 6,845,043 B2
(45) Date of Patent: Jan. 18, 2005

(54) METHOD OF VERIFYING A SEMICONDUCTOR INTEGRATED CIRCUIT APPARATUS, WHICH CAN SUFFICIENTLY EVALUATE A RELIABILITY OF A NON-DESTRUCTIVE FUSE MODULE AFTER IT IS ASSEMBLED

(75) Inventor: Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 217 days.

(21) Appl. No.: 10/310,623

(22) Filed: Dec. 5, 2002

(65) Prior Publication Data

US 2003/0107931 A1 Jun. 12, 2003

(30) Foreign Application Priority Data

Dec. 7, 2001 (JP) ........................................ 2001/374609

(51) Int. Cl.⁷ .............................................. G11C 16/06
(52) U.S. Cl. ............................ 365/185.22; 365/189.05; 365/189.07
(58) Field of Search ........................ 365/185.22, 185.01, 365/189.07, 200, 201, 230.03, 230.08, 189.05

(56) References Cited

U.S. PATENT DOCUMENTS 6,532,181 B2 * 3/2003 Saito et al. ................. 365/200
6,538,924 B2 * 3/2003 Dono et al. ............ 365/185.08

FOREIGN PATENT DOCUMENTS

JP 2001-229690 8/2001
JP 2002-025288 1/2002

OTHER PUBLICATIONS

Shukuri, et al., "CMOS Process IE-Flash (Inverse Gate Electrode Flash) Technology for System-on-a Chip", Oct. 2000.

* cited by examiner

*Primary Examiner*—Son T. Dinh
*Assistant Examiner*—Toan Le
(74) *Attorney, Agent, or Firm*—Katten Muchin Zavis Rosenman

(57) ABSTRACT

A method of verifying a semiconductor integrated circuit apparatus includes (a) providing a semiconductor integrated circuit apparatus including: a first transistor which has a floating gate in which a potential is floated and to which data is written; a second transistor which has a floating gate connected together with the floating gate and reads out the data written to the first transistor; and a control gate unit, which is coupled to the floating gate, controlling an operation of reading out the data of the second transistor; (b) comparing a first data outputted through the second transistor when a first potential is applied to the control gate unit with a second data outputted through the second transistor when a second potential is applied to the control gate unit to generate a comparison result; and (c) verifying the data written to the floating gate based on the comparison result.

22 Claims, 14 Drawing Sheets

Fig. 1 PRIOR ART

| CLASSIFICATION | MATERIAL/METHOD | PROCESS | AREA | RELIABILITY | RELIEVING A DEFECT AFTER THE ASSEMBLY |
|---|---|---|---|---|---|
| DESTRUCTIVE FUSE | POLISILICON GATE | ◎ | ◎ | ◎ | × |
| | CAPACITANCE PLATE | | | | |
| | METAL WIRE | | | | |
| ELECTRICALLY DESTRUCTIVE FUSE | CAPACITANCE INSULATING FILM | △ (HIGH WITHSTANDING VOLTAGE TRANSISTOR IS NEEDED AS COMPARED WITH NON-DESTRUCTIVE FUSE) | △ | ○ | ◎ |
| | GATE INSULATING FILM | | | | |
| NON-DESTRUCTIVE FUSE | EPROM FLASH | ○ | △ | △ | ◎ |

Fig. 5

STATE OF NON-VOLATILE MEMORY CONTROL CIRCUIT

| OPERATION | INPUT | | |
|---|---|---|---|
| | SL | CG | PRG |
| PROGRAM "0" | VPPH | VPPH | VCLH |
| PROGRAM "1" | VPPH | VPPH | VSS |
| ERASING | VPPH | VSS | VCLH |
| READING | VSS | VCL | VSS |
| STANDBY | VSS | VSS | VSS |

STATE OF CONTROLLING OUTSIDE OF THE CHIP

| VERIFICATION | VSS | EXTERNAL APPLICATION | VSS |
|---|---|---|---|

VCL: POWER SUPPLY VOLTAGE
  (HIGH POWER SUPPLY VOLTAGE VCLH)
VPP: BOOST VOLTAGE
  (HIGH POWER SUPPLY BOOST VOLTAGE VPPH)
VSS: GROUND POTENTIAL

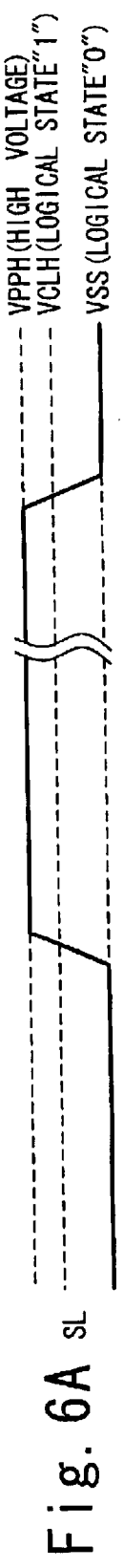
Fig. 6A SL
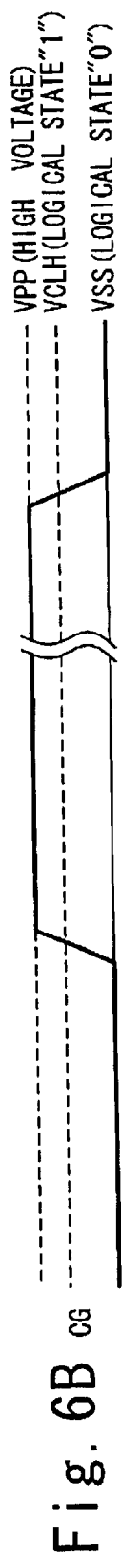
Fig. 6B CG
Fig. 6C PRG
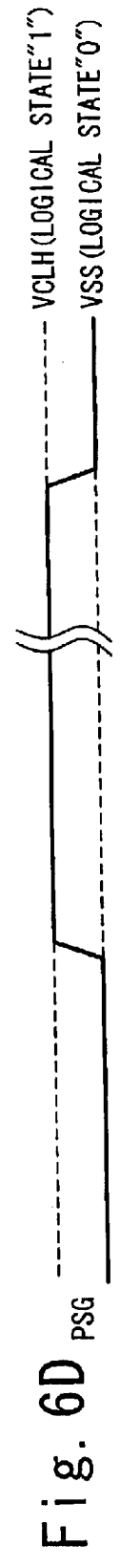
Fig. 6D PSG
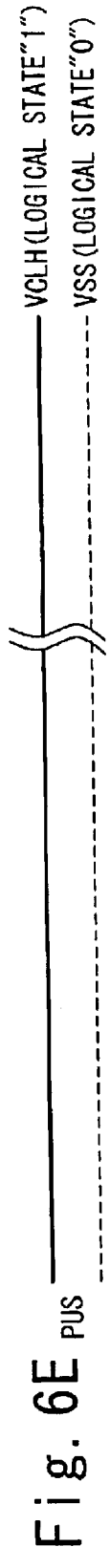
Fig. 6E PUS
Fig. 6F PU

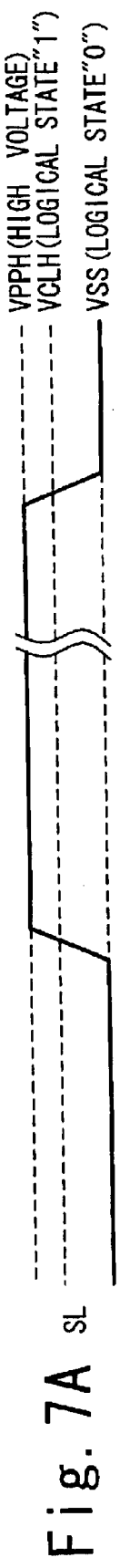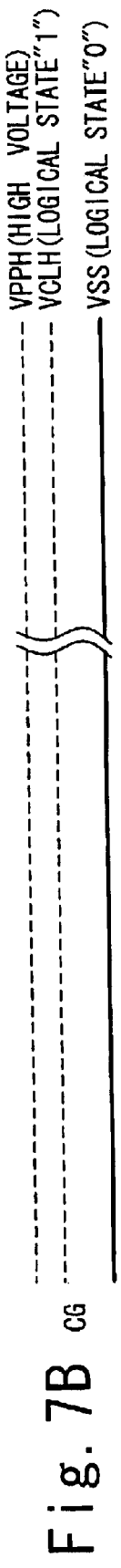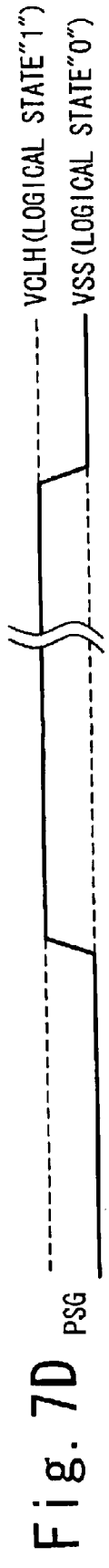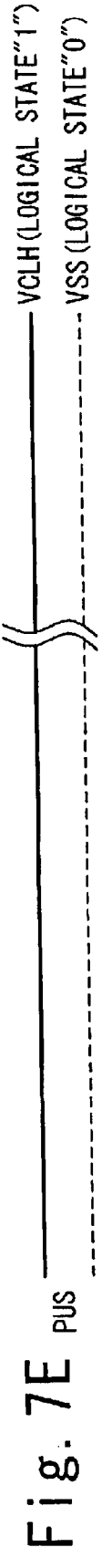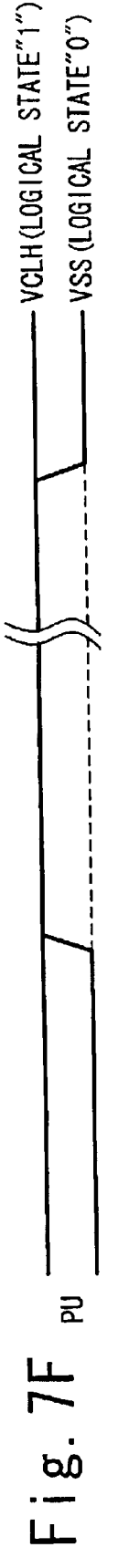

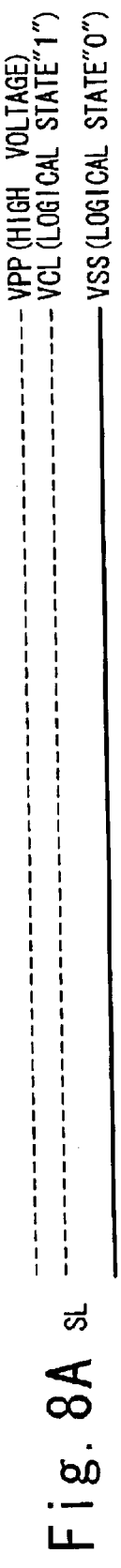
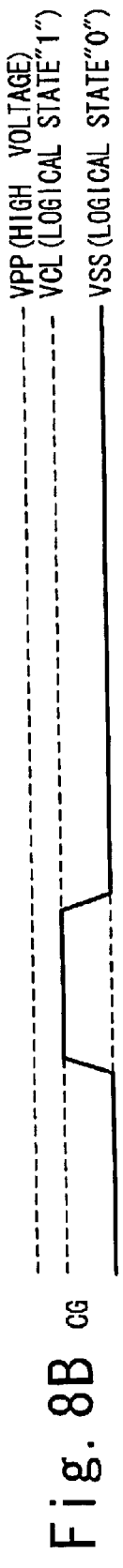
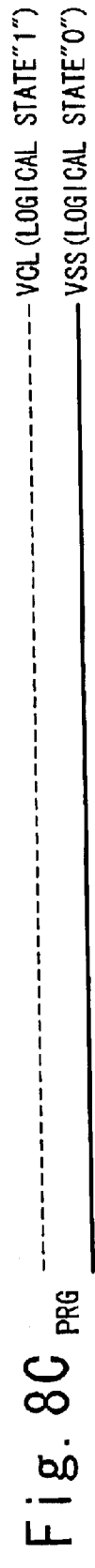
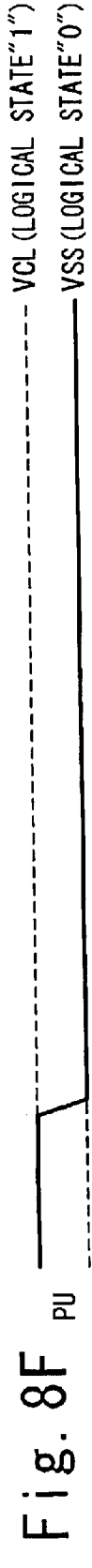
Fig. 8A SL
Fig. 8B CG
Fig. 8C PRG
Fig. 8D PSG
Fig. 8E PUS
Fig. 8F PU

Fig. 10

STATE OF NON-VOLATILE MEMORY CONTROL CIRCUIT

| OPERATION | INPUT | | |
|---|---|---|---|
| | SL | CG | PRG |
| PROGRAM "0" | VPPH | VPPH | VCLH |
| PROGRAM "1" | VPPH | VPPH | VSS |
| ERASING | VPPH | VSS | VCLH |
| READING | VSS | VCL | VSS |
| STANDBY | VSS | VSS | VSS |
| VERIFICATION | VSS | VCL→VPP | VSS |

VCL: POWER SUPPLY VOLTAGE
    (HIGH POWER SUPPLY VOLTAGE VCLH)

VPP: BOOST VOLTAGE
    (HIGH POWER SUPPLY BOOST VOLTAGE VPPH)

VSS: GROUND POTENTIAL (LOW WHEN ADDRESS HIT OR VERIFICATION IS OK STATE)

MISS HIT JUDGING CIRCUIT DIAGRAM

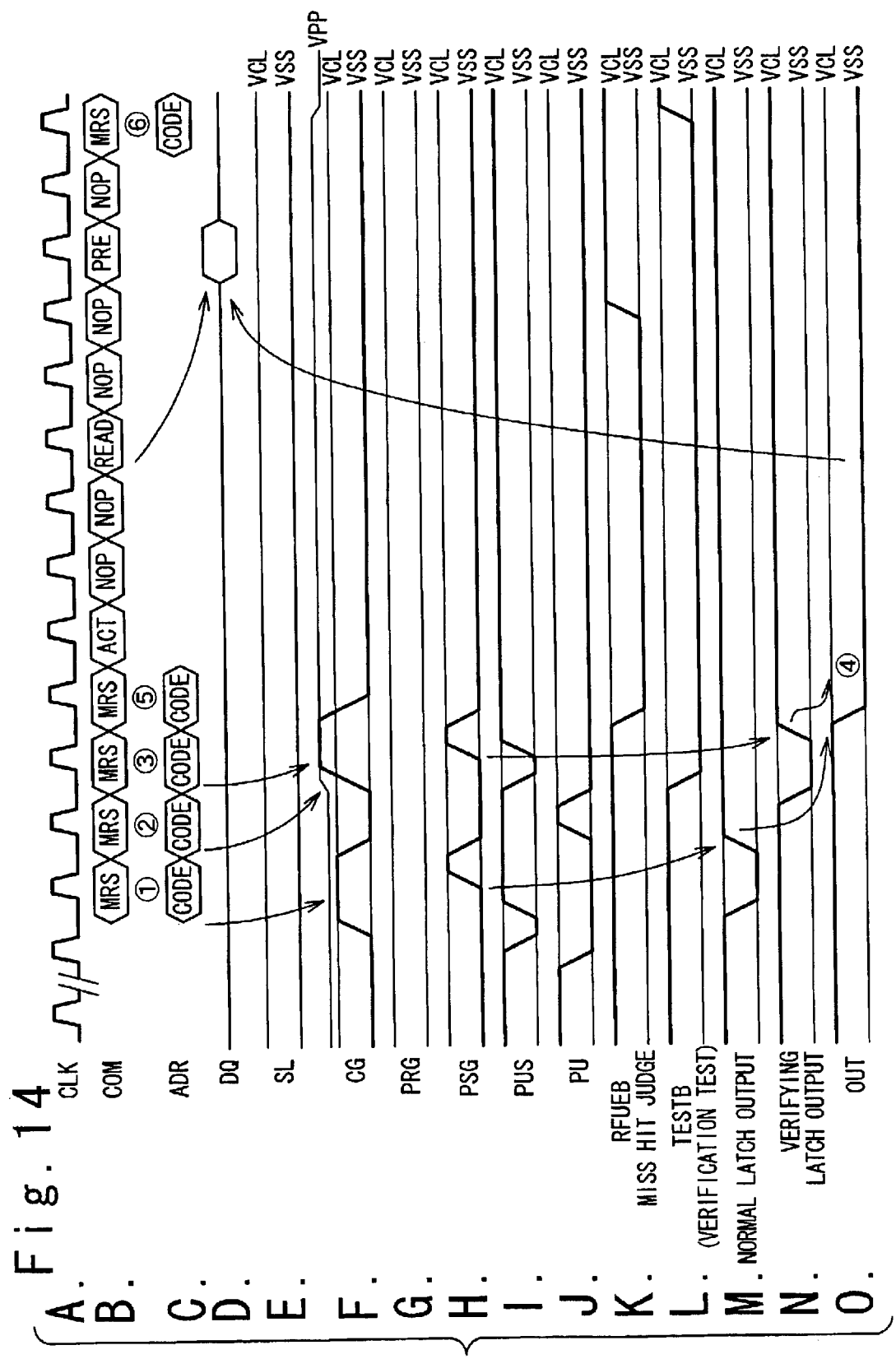

METHOD OF VERIFYING A SEMICONDUCTOR INTEGRATED CIRCUIT APPARATUS, WHICH CAN SUFFICIENTLY EVALUATE A RELIABILITY OF A NON-DESTRUCTIVE FUSE MODULE AFTER IT IS ASSEMBLED

BACKGROUND OF THE INVENTION

1. Field of the Invention

The present invention relates to a method of verifying a semiconductor integrated circuit apparatus, which can sufficiently evaluate a reliability of a non-destructive fuse module after it is assembled, and a semiconductor integrated circuit apparatus.

2. Description of the Related Art

Conventionally, in a semiconductor integrated circuit in which a memory circuit or a semiconductor memory such as RAM (Random Access Memory) and the like is built in, a redundancy circuit provided with an address setting circuit for storing a spare memory row and memory line and a defective address and the like is installed in order to improve a yield by relieving a defect bit (a defective memory cell) included in a memory array.

A method of using a fuse that can be programmed by carrying out a physical destruction through a laser and the like is typically done in setting a defective address in such a redundancy circuit. In a relieving method of cutting away the fuse through the above-mentioned laser, storing a defective address information, comparing with an input address and replacing with a spare memory line or a spare memory row, the fuse must be cut away before a memory chip is sealed in a package. For this reason, it is impossible to relieve a defect induced after the memory chip is sealed in the package. This results in a trouble that a sufficient improvement of a yield can not be attained.

So, a technique is proposed for installing a non-volatile memory such as EEPROM (Electrical Erasable Programmable Read Only Memory) and EPROM (Electrical Programmable Read Only Memory) in a chip of DRAM (Dynamic Random Access Memory) and storing a defective address information as a non-destructive fuse.

If such a relieving method is used, the defective address information can be written to the non-volatile memory even after the chip is sealed in the package. Thus, the defect induced after the chip is sealed in the packaged can be relieved to thereby improve the yield.

There is the technique for improving the yield by mounting the fuse in order to relieve the defect bit after the assembly (after it is sealed in the package) as mentioned above. FIG. 1 shows various fuse methods that have been conventionally put to practical use.

In a case of DRAM, the restriction of a product specification (a package arrangement and the like) is severer than that of a custom product such as a mixture memory and the like. It is difficult to additionally mount a new outer terminal.

So, the non-volatile memory (EPROM) may be employed as a reliable fuse after it is assembled, in which a voltage that can be boosted in a chip can be used.

As shown in FIG. 1, the non-volatile memory has the problem of the reliability as compared with the conventional destructive fuse. However, the problem of the reliability is at the ignorable level in a process in which a thickness of a gate oxide film is thick (a process of 13 nm or more and 0.8 μm).

However, if EPROM is used, it is expected that the thinner thickness of the gate oxide film (for example, 8 nm or less) associated with a higher integration and a lower voltage causes the deterioration in an accumulated charge retaining property, which results in a problem of a reliability reservation.

A method of verifying a semiconductor integrated circuit apparatus, which can sufficiently evaluate a reliability of a non-destructive fuse module after it is assembled, and a semiconductor integrated circuit apparatus are desired.

A method of verifying a semiconductor integrated circuit apparatus, which can sufficiently evaluate a reliability of a non-destructive fuse module after it is assembled without increasing a circuit area, and a semiconductor integrated circuit apparatus are desired.

A method of verifying a semiconductor integrated circuit apparatus, which can sufficiently evaluate a reliability of a non-destructive fuse module after it is assembled in a short evaluation time, and a semiconductor integrated circuit apparatus are desired.

A method of verifying a semiconductor integrated circuit apparatus, which can sufficiently evaluate a reliability of a non-destructive fuse module after it is assembled, and a semiconductor integrated circuit apparatus are especially desired in DRAM in which EPROM (CMOS Process Compatible ie-Flash (inverse gate electrode Flash)) that can be manufactured by using a standard CMOS manufacturing process in its original state is used as a reliving circuit, which will be describe later.

By the way, Japanese Laid Open Patent Application (JP-A-2001-229690) discloses the following semiconductor integrated circuit apparatus. That is, in the semiconductor integrated circuit apparatus, an address to relieve a defect of a memory array in a semiconductor device or a trimming information is stored with a nonvolatile memory element using as a floating electrode a polycrystalline silicon layer of a first layer which can be formed by a CMOS device manufacturing process.

SUMMARY OF THE INVENTION

The present invention has been made to solve the above-described problems of the conventional a method of verifying a semiconductor integrated circuit apparatus. Therefore, an object of the present invention is to provide a method of verifying a semiconductor integrated circuit apparatus, which can sufficiently evaluate a reliability of a non-destructive fuse module after it is assembled, and a semiconductor integrated circuit apparatus. Another object of the present invention is to a method of verifying a semiconductor integrated circuit apparatus, which can sufficiently evaluate a reliability of a non-destructive fuse module after it is assembled without increasing a circuit area, and a semiconductor integrated circuit apparatus. Still another object of the present invention is to provide a method of verifying a semiconductor integrated circuit apparatus, which can sufficiently evaluate a reliability of a non-destructive fuse module after it is assembled in a short evaluation time, and a semiconductor integrated circuit apparatus. Still another object of the present invention is to provide a method of verifying a semiconductor integrated circuit apparatus, which can sufficiently evaluate a reliability of a non-destructive fuse module after it is assembled, and a semiconductor integrated circuit apparatus, especially in DRAM in which EPROM (CMOS Process Compatible ie-Flash (inverse gate electrode Flash)) that can be manufactured by using a standard CMOS manufacturing process in its original state is used as a reliving circuit, which will be describe later.

In order to achieve an aspect of the present invention, a method of verifying a semiconductor integrated circuit apparatus, includes: (a) providing a semiconductor integrated circuit apparatus including: a first transistor which has a floating gate in which a potential is floated and to which data is written; a second transistor which has a floating gate connected together with the floating gate and reads out the data written to the first transistor; and a control gate unit, which is coupled to the floating gate, controlling an operation of reading out the data of the second transistor; (b) comparing a first data outputted through the second transistor when a first potential is applied to the control gate unit with a second data outputted through the second transistor when a second potential is applied to the control gate unit to generate a comparison result; and (c) verifying the data written to the floating gate based on the comparison result, and wherein the first potential is different from the second potential.

In this case, the first potential is a potential supplied from an external portion to the semiconductor integrated circuit apparatus when the data is read out, and wherein the second potential is a potential generated by boosting the first potential in the semiconductor integrated circuit apparatus.

Also in this case, at the (b), the first data latched by a first latching circuit is compared with the second data latched by a second latching circuit.

Further in this case, at the (b), the second potential that is trimmed is applied to the control gate unit.

In this case, at the (b), the second potential is higher than or equal to a potential which is supplied from an external portion to the semiconductor integrated circuit apparatus when the data is read out, and is lower than or equal to a boost potential in which a potential supplied from the external portion to the semiconductor integrated circuit apparatus when the data is programmed, is boosted.

In order to achieve another aspect of the present invention, a semiconductor integrated circuit apparatus, includes: a first transistor which has a floating gate in which a potential is floated and to which data is written; a second transistor which has a floating gate connected together with the floating gate and reads out the data written to the first transistor; and a control gate unit which is coupled to the floating gate and controls an operation of reading out the data of the second transistor, and whereina verifying operation of the data written to the floating gate is performed based on a comparison result of comparing a first data outputted through the second transistor when a first potential is applied to the control gate unit with a second data outputted through the second transistor when a second potential is applied to the control gate unit, and wherein the first potential is different from the second potential.

In this case, the semiconductor integrated circuit apparatus further includes: a second latch circuit latching the second data.

Also in this case, the second potential that is trimmed is applied to the control gate unit.

Further in this case, the first potential is supplied to the semiconductor integrated circuit apparatus from an external portion, and the second potential is generated in the semiconductor integrated circuit apparatus.

In this case, the first potential is a potential supplied from an external portion to the semiconductor integrated circuit apparatus when the data is read out.

Also in this case, the second potential is a potential generated by boosting the first potential in the semiconductor integrated circuit apparatus.

Further in this case, the first potential is a potential applied to the control gate unit when the data is read out.

In this case, the second potential is a potential generated by boosting in the semiconductor integrated circuit apparatus a third potential supplied from an external portion to the semiconductor integrated circuit apparatus when the verifying operation is performed.

Also in this case, the third potential is different from the first potential.

Further in this case, the second potential is lower than a fourth potential generated by boosting in the semiconductor integrated circuit apparatus a fifth potential supplied from an external portion to the semiconductor integrated circuit apparatus when the data is written.

In this case, the second potential is lower than a sixth potential applied to the control gate unit when the data is written.

Also in this case, a first electrode of the first transistor is connected to a data input terminal to which the data is inputted, and wherein when the data is written to the first transistor, a seventh potential different from each of the first potential and the second potential is applied to a second electrode of the first transistor.

Further in this case, each of the first transistor, the second transistor and the control gate unit is constituted by a high withstanding voltage MOS transistor having a single gate structure, and wherein the first transistor, the second transistor and the control gate unit are formed in structures which can be manufactured by a CMOS manufacturing process.

In this case, a defective address data indicating a defective address of a DRAM is written to the semiconductor integrated circuit apparatus as the data, and wherein the second potential is a word line boost potential of the DRAM.

Also in this case, a comparison the first data with the second data is performed in an address comparator comparing the defective address with an input address which is used to access the DRAM.

Further in this case, a first signal indicating a result of a comparison the first data with the second data is outputted from a redundancy roll call circuit to output a second signal indicating the defective address which is relieved after the semiconductor integrated circuit apparatus is assembled to an external portion of the semiconductor integrated circuit apparatus.

In this case, the semiconductor integrated circuit apparatus is an EEPROM.

BRIEF DESCRIPTION OF THE DRAWINGS

FIG. 1 is a table comparing the reliabilities of conventionally typical destructive fuse, electrically destructive fuse and non-destructive fuse and the relieves after they are assembled thereof and the like;

FIG. 5 is a table showing voltages applied to respective terminals of the EPROM cell EC of FIG. 4, depending on an operation;

FIG. 6A is a timing chart showing a writing (program) operation to the EPROM cell EC of FIG. 4;

FIG. 6B is another timing chart showing a writing (program) operation to the EPROM cell EC of FIG. 4;

FIG. 6C is still another timing chart showing a writing (program) operation to the EPROM cell EC of FIG. 4;

FIG. 6D is yet still another timing chart showing a writing (program) operation to the EPROM cell EC of FIG. 4;

FIG. 6E is still another timing chart showing a writing (program) operation to the EPROM cell EC of FIG. 4;

FIG. 6F is yet still another timing chart showing a writing (program) operation to the EPROM cell EC of FIG. 4;

FIG. 7A is a timing chart showing an operation for erasing the EPROM cell EC of FIG. 4;

FIG. 7B is another timing chart showing an operation for erasing the EPROM cell EC of FIG. 4;

FIG. 7C is still another timing chart showing an operation for erasing the EPROM cell EC of FIG. 4;

FIG. 7D is yet still another timing chart showing an operation for erasing the EPROM cell EC of FIG. 4;

FIG. 7E is still another timing chart showing an operation for erasing the EPROM cell EC of FIG. 4;

FIG. 7F is yet still another timing chart showing an operation for erasing the EPROM cell EC of FIG. 4;

FIG. 8A is a timing chart showing an operation for reading out the EPROM cell EC of FIG. 4;

FIG. 8B is a timing chart showing an operation for reading out the EPROM cell EC of FIG. 4;

FIG. 8C is a timing chart showing an operation for reading out the EPROM cell EC of FIG. 4;

FIG. 8D is a timing chart showing an operation for reading out the EPROM cell EC of FIG. 4;

FIG. 8E is a timing chart showing an operation for reading out the EPROM cell EC of FIG. 4;

FIG. 8F is a timing chart showing an operation for reading out the EPROM cell EC of FIG. 4;

FIG. 10 is a table showing voltages applied to respective terminals of an EPROM cell EC, depending on an operation, in the first embodiment of the semiconductor integrated circuit apparatus in the present invention;

FIG. 14A is a timing chart showing an operation example of the second embodiment of the semiconductor integrated circuit apparatus in the present invention;

FIG. 14B is another timing chart showing an operation example of the second embodiment of the semiconductor integrated circuit apparatus in the present invention;

FIG. 14C is still another timing chart showing an operation example of the second embodiment of the semiconductor integrated circuit apparatus in the present invention;

FIG. 14D is yet still another timing chart showing an operation example of the second embodiment of the semiconductor integrated circuit apparatus in the present invention;

FIG. 14E is still another timing chart showing an operation example of the second embodiment of the semiconductor integrated circuit apparatus in the present invention;

FIG. 14F is yet still another timing chart showing an operation example of the second embodiment of the semiconductor integrated circuit apparatus in the present invention;

FIG. 14G is still another timing chart showing an operation example of the second embodiment of the semiconductor integrated circuit apparatus in the present invention;

FIG. 14H is yet still another timing chart showing an operation example of the second embodiment of the semiconductor integrated circuit apparatus in the present invention;

FIG. 14I is still another timing chart showing an operation example of the second embodiment of the semiconductor integrated circuit apparatus in the present invention;

FIG. 14J is yet still another timing chart showing an operation example of the second embodiment of the semiconductor integrated circuit apparatus in the present invention;

FIG. 14K is still another timing chart showing an operation example of the second embodiment of the semiconductor integrated circuit apparatus in the present invention;

FIG. 14L is yet still another timing chart showing an operation example of the second embodiment of the semiconductor integrated circuit apparatus in the present invention;

FIG. 14M is still another timing chart showing an operation example of the second embodiment of the semiconductor integrated circuit apparatus in the present invention;

FIG. 14N is yet still another timing chart showing an operation example of the second embodiment of the semiconductor integrated circuit apparatus in the present invention; and FIG. 14O is still another timing chart showing an operation example of the second embodiment of the semiconductor integrated circuit apparatus in the present invention.

DESCRIPTION OF THE PREFERRED EMBODIMENTS

An embodiment of the present invention will be described below with reference to the attached drawings.

The feature of this embodiment lies in an operation for effectively screening DRAM that includes a non-volatile memory as a relieving circuit.

The content of a technique filed as Japanese Patent Application (Japanese Patent Application Number 2000-199900) that was invented earlier than this application by this inventor is described prior to the explanation of this embodiment.

Figure 2:
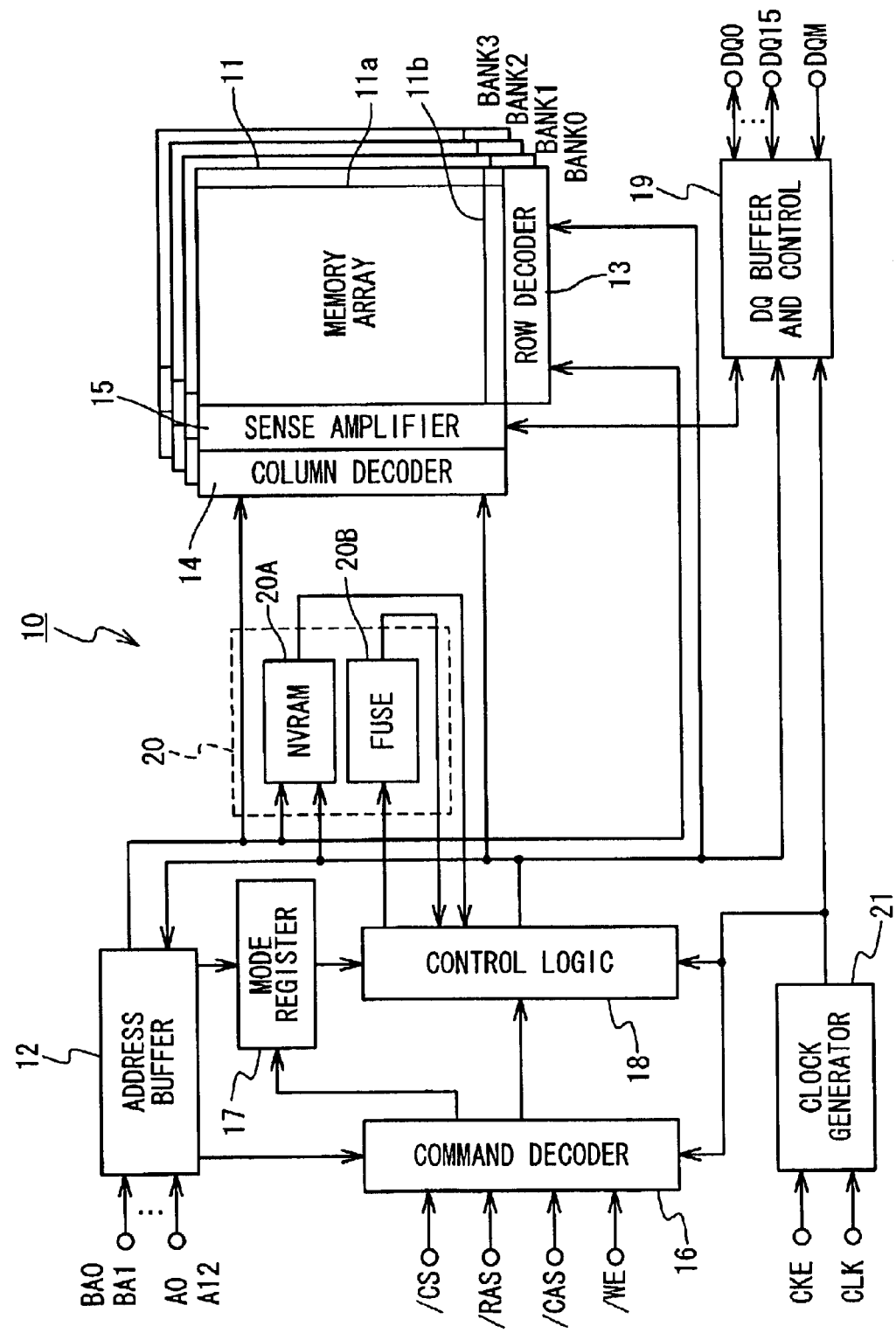
FIG. 2 is a block diagram showing a configuration of a technique of Japanese Laid Open Patent Application (JP-A 2000-199900)

FIG. 2 shows the configuration of the technique of Japanese Laid Open Patent Application (JP-A 2000-199900).

In addition to a fuse (refer to a symbol 20B), an electrically programmable non-volatile memory (NVRAM) (a symbol 20A) is mounted in order to relieve a defect after the DRAM is assembled.

The non-volatile memory has a large area per unit bit, as compared with a conventional type fuse for cutting away a wiring. So, the increase in a chip area is suppressed by relieving a defect prior to the assembly through the fuse 20B and relieving a defect after it is assembled through the non-volatile memory 20A.

All of circuit blocks shown in FIG. 2 are formed on one semiconductor chip such as a single crystal silicon. Elements illustrated by ○ marks are pads serving as outer terminals placed on the semiconductor chip. A power supply voltage terminal to which a power supply voltage supplied from an external portion is applied is placed besides the illustrated outer terminals.

An SDRAM (Synchronous Dynamic Random Access Memory) 10 shown in FIG. 2 is operated synchronously with a clock. The SDRAM 10 is provided with a memory cell array 11, an address buffer 12, a low address decoder 13, a column address decoder 14, a sense amplifying circuit 15, a command decoder 16, a mode register 17, a control circuit 18, a data input output circuit 19, an address comparing circuit 20 and a clock generating circuit 21.

In the memory cell array 11, a plurality of memory cells are arranged in a shape of a matrix. For example, it is composed of four banks BANK0 to BANK3.

The address buffer 12 captures an address data (hereafter, abbreviated as an address) inputted from the external portion, based on a multiplexing method.

The column address decoder 14 decodes a row address captured by the address buffer 12, and selects a corresponding column (a bit line) within the memory cell array 11.

The low address decoder 13 decodes a line address captured by the address buffer 12, and selects a corresponding word line within the memory cell array 11.

The sense amplifying circuit 15 amplifies and outputs a potential of the selected bit line when a data is read out, and writes the data from the external portion to the memory cell when the data is written.

The command decoder 16 receives a control signal, such as a chip selection signal/CS and the like, which is inputted from the external portion, and interprets a command.

An operation mode based on the input command is set for the mode register 17.

The control circuit 18 generates an inner control signal on the basis of the input command and a state of the mode register 17.

The data input output circuit 19 outputs the data read out from the memory cell array 11 to the external portion, captures an input data from the external portion, and passes to the sense amplifying circuit 15.

The address comparing circuit 20 uses the non-volatile memory device and the fuse, such as EEPROM and EPROM, and stores a defect address (an address information corresponding to a defect line), and compares the defect address with an address input (accessed) from the external portion. If they coincide with each other, it is designed to select a spare memory line (a redundancy line) 11a or a spare memory row (a redundancy line) 11b within the memory array 11, instead of the defect line. Through this process, a functional defect line is replaced with the redundancy line.

The clock generating circuit 21 generates a clock signal for operating an inner circuit on the basis of a clock enabling signal CKE indicating that a clock signal CLK of a constant frequency supplied from the external portion and a clock are valid.

The defect address is not one. It is designed so as to be able to set a plurality of defect addresses (two in this embodiment) on the basis of the number of the spare memory lines 11a or the spare memory rows 11b, for each memory banks BANK0 to BANK3 of the memory array 11.

As the control signal inputted from the external portion to the command decoder 16, there are a line address strobe signal/RAS (hereafter, referred to as an RAS signal), a write enabling signal/WE for instructing a data writing operation and the like, in addition to the chip selection signal/CS for setting the chip at the selection state. A signal in which "/" is given before a symbol among those signals implies that a low level is a valid level.

The command decoder 16 decodes a part of the address signal and those control signals/CS, /RAS, /CAS, and /WE, and interprets the input command. Such a command method is typical in the SDRAM. Moreover, as the command in the SDRAM of this embodiment, there are a READ command for instructing a reading operation, a WRITE command for instructing a writing command, an MRS command for instructing the setting of the operation mode for the mode register 17 and the like.

As the commands supplied from the external portion, there are bank addresses BA0, BA1 for indicating a bank of the memory array 11 and addresses A0, A12 for indicating a memory cell within the bank.

The data input output circuit 19 is designed, for example, such that whether or not data DQ0 to DQ15 of 16 bits are masked (made valid) is determined in accordance with a control signal DQM supplied from the external portion.

A first defective address setting & comparing circuit 20A and a second defective address setting & comparing circuit 20B are installed in the address comparing circuit 20.

The first defective address setting & comparing circuit 20A has an EPROM (NVRAM) cell to set a defective address information, compares the set address with an input address and judges whether or not they coincide with each other.

The second defective address setting & comparing circuit 20B has a fuse for setting the defective address information.

The defective address detected before a chip is sealed in a package is set for the second defective address setting & comparing circuit 20B.

The defective address detected after the chip is sealed in the package is set for the first defective address setting & comparing circuit 20A.

The control circuit 18 includes a circuit for generating a switching control signal to select the spare memory line 11a or the spare memory row 11b if the set defective address and the input address coincide with each other as the compared result between them, and to supply it to the address decoder 13 or 14.

The setting of the defective address through the fuse is done by cutting away through a laser and the like.

The setting of the defective address for the EPROM is done such that the data captured by the address buffer 12 at a time of a test mode is inputted as the write data of the EPROM cell to the first defective address setting & comparing circuit 20A.

Consequently, the defective bit can be relieved even after the chip is sealed in the package, and the increase in the circuit size can be suppressed as compared with the case of only the defective address setting circuit containing the EPROM cell.

The configuration example of the first defective address setting & comparing circuit 20A will be described below with reference to FIG. 3. The first defective address setting & comparing circuit 20A has four banks 201 to 204. The reason why the first defective address setting & comparing circuit 20A has the four banks 201 to 204 is that they correspond to the four banks (BANK 0 to 3) of the memory array 11 of FIG. 2.

Each of the banks 201 to 204 has two address sets (set 0, set 1). The single address set is constituted by a non-volatile memory array 210 composed of (N+1) EPROM cells EC. The non-volatile memory array 210 has N (corresponding to N bits) EPROM cells EC (address bits) to store a defective address (a full-address) of N bits and one (corresponding to one bit) EPROM cell EC (enabling bit) indicating that the information stored in the N EPROM cells EC is valid.

At an initial state, a zero data (a data that is not programmed in the non-volatile memory array 210) is stored in a latch 240. For this reason, the enabling bit indicates whether or not the defective address data transferred to the latch 240 from the non-volatile memory array 210 is valid, namely, whether or not it is the data programmed in the nonvolatile memory array 210. It is programmed at the same time when the address is programmed.

The first defective address setting & comparing circuit 20A includes the 8 sets of the non-volatile memory arrays 210 at a total of four banks 201 to 204.

Two sets of non-volatile memory arrays 210 are installed in each of the banks 201 to 204 of the first defective address setting & comparing circuit 20A so as to enable two defective addresses (N bits) to be set for each of the banks BANK 0 to 3 of the memory array 11.

A control circuit 220 for inputting the control signal to each of the two sets of the non-volatile memory arrays 210 is installed in each of the banks 201 to 204. The control circuit 220 selectively inputs potentials VPP, VCL, which will be described later, from a VPP generating circuit 401 and a VCL generating circuit 402.

The control circuit 220 decodes the command inputted to each terminal of the non-volatile memory array 210 (the EPROM cell EC of FIG. 4), correspondingly to each of operations (a program "0", a program "1", an erasing, a reading and a standby) in a table of FIG. 5, which will be described later, and provides a control signal of the EPROM cell EC and a program data.

Also, each of the banks 201 to 204 has an address comparing circuit 230 for comparing the defective address set for each of the two sets of the non-volatile memory arrays 210 with the input address supplied from the address buffer 12.

If the control circuit 220 receives the control signal indicative of the program from an input terminal in and a data (a defective address data) from an address terminal adr, a data is programmed in the non-volatile memory array 210.

If the control circuit 220 receives the control signal indicative of the erasing from the input terminal in, the data of the non-volatile memory array 210 is erased.

If the control circuit 220 receives the control signal indicative of the reading from the input terminal in, the data of the non-volatile memory array 210 is read out to the latch 240.

If the control circuit 220 receives the control signal indicative of the standby from the input terminal in, the non-volatile memory array 210 becomes at the state of the standby.

If the control circuit 220 receives the control signal indicative of a verification from the input terminal in, the non-volatile memory array 210 becomes at a state of the verification.

The data of the non-volatile memory array 210 is typically transferred to the latch 240 at a time of an actuation of the chip or based on an MRS command, for the sake of the faster speed of the access.

The above-mentioned input of the control signal and the data is carried out by using a test mode command inputted to the control circuit 220 through the input terminal in from an external test apparatus, and the non-volatile memory array 210 is controlled through the control circuit 220.

The address comparing circuit 230 has address comparators 231 and a miss hit judging unit 232. The address comparator 231 compares one bit of a defective address stored in the EPROM cell EC in the operation for reading the EPROM cell (non-volatile memory array cell) EC with one bit of a DRAM access address, and outputs a hit signal to the miss hit judging unit 232 if they coincide with each other. The miss hit judging unit 232, if the enabling bit is invalid and the hit signals are received from all of the address comparators 231, judges that a relief address programmed in the non-volatile memory array 210 coincides with the DRAM access address, and outputs an address hit signal hit, and sends a replacement indication to the address decoder through a roll call circuit 235 and a control circuit 18, and selects the spare memory line or row, and then outputs the data of the memory cell.

A series of operations of the first defective address setting & comparing circuit 20A of FIG. 2 will be described below in brief. An inspecting step after it is assembled is carried out by a method of using a test pattern through an external test apparatus (not shown). That is, in the test apparatus, an address and a data are inputted to a chip, and a predetermined data is written to a predetermined address of the memory array 11. Then, the data read out from the memory array 11 is compared with an expectation data, and its compared result is written to FBM (Fail Bit Memory) of the test apparatus. Next, in the test apparatus, a relief judgment is done by a software, on the basis of the data written to the FBM, and a defective address is detected.

If the defective address is detected by the test apparatus, a test mode is carried out for programming the defective address in the non-volatile memory array 210. In the test apparatus, the defective address is inputted to the address buffer 12, the control signal is inputted to the command decoder 16 and used as the test mode. Then, in the control circuit 18, as the program operation to the EPROM cell EC, a control circuit 220 programs the defective address in the non-volatile memory array 210.

As mentioned above, after the defective address is programmed in the non-volatile memory array 210, the relieving step is ended.

When the operation is done from a next time, at the time of the actuation of the chip, the defective address is read out from the non-volatile memory array 210 to the latch 240, and transiently stored therein.

When the SDRAM 10 is actually operated, if an address (an address accessed from the external portion) of the memory array 11 is inputted from the address terminal adr, the address comparator 231 compares the address accessed from the external portion with the defective address read out to the latch 240.

In the address comparator 231, if both of the addresses coincide with each other as the compared result, an address hit signal is set to an enabling state, and a coincidence detection signal is sent to the control circuit 18 of FIG. 2. The control circuit 18 outputs a switching signal (or a replacing address) for selecting a spare memory line or a spare memory row, to the address decoder 13 or 14.

The configuration of the EPROM cell EC constituting the non-volatile memory array 210 will be described below with reference to FIG. 4.

Figure 4:
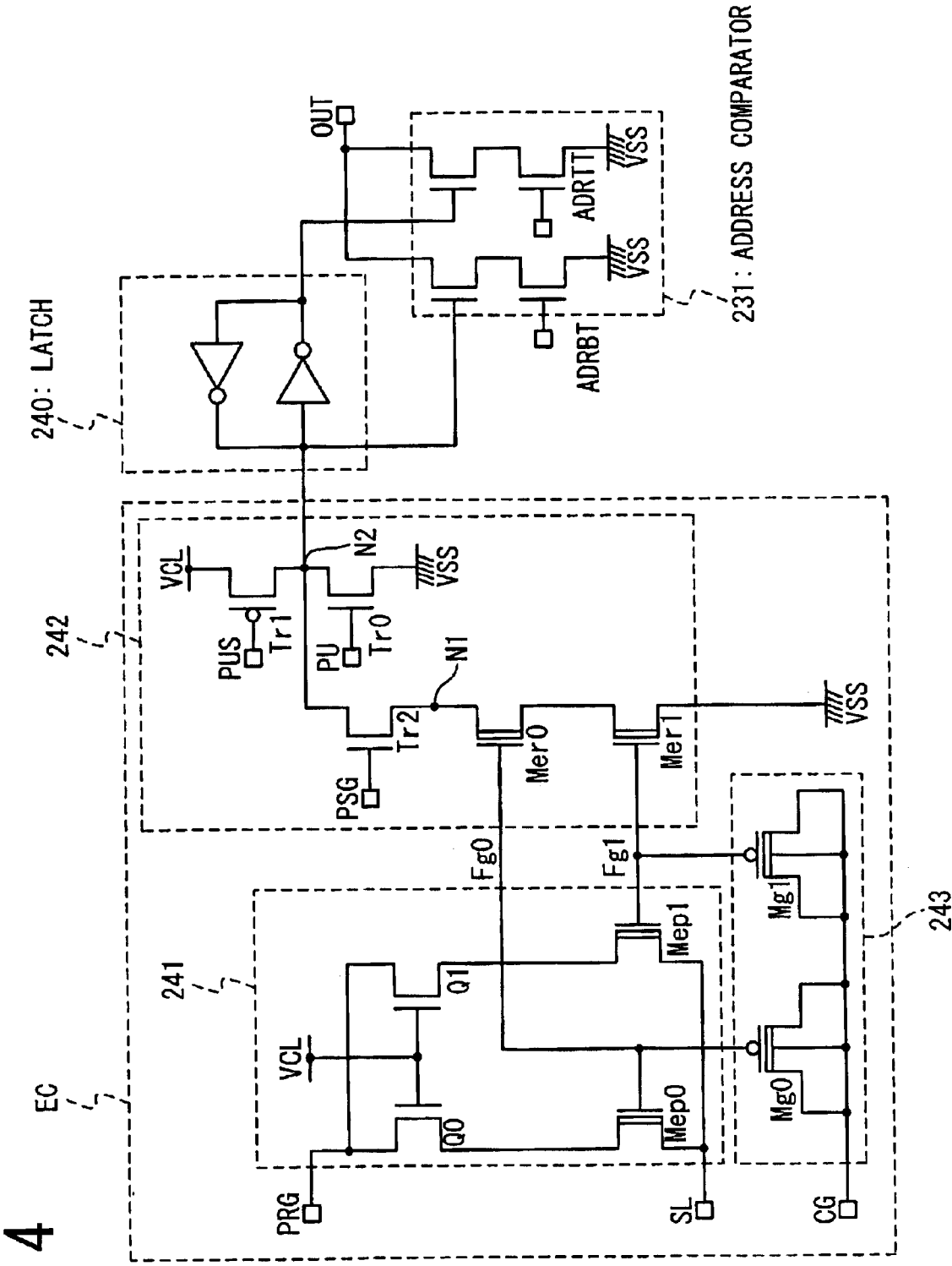
FIG. 4 is a block diagram showing a configuration example of an EPROM cell EC in FIG. 3 and its periphery.

As shown in FIG. 4, the EPROM cell EC is provided with a writing circuit 241, a reading circuit 242 and a control gate circuit 243. Cell transistors Mep0, Mep1, Mg0, Mg1, Mer0 and Mer1 are constituted by high withstanding voltage transistors. Sources and drains of PMOS Mg0, Mg1 are commonly connected to each other and connected to a control terminal CG. Floating gates Fg0, Fg1 of the cell transistors Mep0, Mep1, Mg0, Mg1, Mer0 and Mer1 are controlled through the control terminal CG by capacitive coupling.

The cell transistors Mep0, Mep1, Mg0, Mg1, Mer0 and Mer1 are designed as follows. That is, each of them does not use the MOSFET of a gate double structure having a floating gate and a control gate, as a memory element. Then, each of them uses the MOSFET of the same structure as the typical MOSFET having only the floating gate, in which a gate insulation film is slightly thick and a withstanding voltage is high, as the memory element. Also, it is configured to store the data by changing a threshold value, depending on whether or not charges are accumulated in the floating gates Fg0, Fg1 of the memory element.

The gate structures of the cell transistors Mep0, Mep1, Mg0, Mg1, Mer0 and Mer1 are equal to that of the typical MOSFET. The respective sets Mep0, Mer0 and Mg0, Mep1, Mer1 and Mg1 of the three MOSFETs constituting the cell have poly-silicon gate electrodes through insulation films on a substrate. Moreover, in the poly-silicon gate electrodes, the gates of the MOSFETs of the respective sets are commonly connected to each other. They function as the floating gates Fg0, Fg1.

In FIG. 4, the three MOSFETs to which the symbols Mep0, Mer0 and Mg0 are given are the cell for storing the data of one bit. In order to improve the reliability of the data, it is configured to install the cell composed of another one set of the MOSFETs Mep1, Mer1 and Mg1 and write the same data as the cell composed of the Mep0, Mer0 and Mg0 thereto. That is, the transistors Mer0, Mer1 are connected in series. Unless both of the transistors Mer0, Mer1 are turned on, a ground potential VSS is not applied to a node N1 of a transistor Tr2.

The cell is composed of the control gate transistors Mg0, Mg1, the program transistors Mep0, Mep1 and the read transistors Mer0, Mer1.

In the three MOSFETs constituting each cell, their gates are coupled to each other. The poly-silicon wirings Fg0, Fg1 functioning as the floating gates are formed through insulation films. The common floating gates Fg0, Fg1 are floated as potentials. Then, it is controlled to store the data by changing the threshold values of Mep0, Mer0, Mep1, and Mer1, depending on whether or not the charges are accumulated in the common floating gates Fg0, Fg1.

The six MOSFETs Mep0, Mer0, Mg0, Mep1, Mer1 and Mg1 constituting the cell are designed as the elements having the high withstanding voltages, in which their gate oxide films are thicker than those of the other MOSFETs.

In the control gate transistors Mg0, Mg1, their sources and drains are coupled to each other and connected to the control terminal CG. By sending a signal to the control terminal CG, the function of the control gates of the read transistors Mer0, Mer1 is carried out (the function of a control gate in an EPROM device having a two-layer gate). In the EPROM device having the two-layer gate, a voltage applied to the control gate is applied to the floating gate by the capacitive coupling. On the contrary, the read transistors Mer0, Mer1 have only one-layer gate (floating gate), and the voltage applied to the control terminal CG is applied to the floating gate through the MOS capacitances of the other control gate transistors Mg0, Mg1. If the VPP is applied to the control terminal CG, the read transistors Mer0, Mer1 are turned ON/OFF in accordance with the data written to the floating gate.

In the program transistors Mep0, Mep1, their sources are commonly connected to each other and connected to a source terminal SL to which the writing/erasing voltage VPP of a high voltage is applied.

The drains of the program transistors Mep0, Mep1 are connected to a write data terminal PRG to which the write data is applied through typical transistors Q0, Q1 (do not have the high withstanding voltage), respectively.

The transistors Q0, Q1 function as constant current devices, in which the power supply voltage VCL is applied to their gates.

The read transistors Mer0, Mer1 are connected such that channels are arranged in series. A source terminal of the read transistor Mer1 is connected to a ground potential VSS (GND). A drain terminal (a node N1) of the read transistor Mer0 is connected to a pre-charging node N2 through a MOSFET Tr2 for controlling a reading operation. A pre-charging MOSFET Tr1 is connected between the pre-charging node N2 and the power supply voltage terminal VCL. A discharging MOSFET Tr0 is connected between the pre-charging node N2 and the ground potential VSS (GND).

The latch 240 composed of a pair of inverters for judging a potential of this node N2 and thereby latching a logical state is connected to the pre-charging node N2.

By the way, the voltages applied to the various terminals SL, CG and PRG and the control signals PSG, PUS and PU shown in FIG. 4 are generated by the control circuit 220 on the basis of the input command, the write data and the like.

The writing (programming) operation of the EPROM cell EC will be described below with reference to FIGS. 4, 5 and 6A to 6F. Here, the VSS is the ground potential, the VCL is the power supply potential supplied from the external portion, and the VPP is a boost voltage of the power supply potential VCL.

At the time of the writing operation, in order to reserve a level to be programmed, a power supply potential VCLH higher than the usual power supply potential (for example, 1.8 V) VCL, for example, a high power supply potential (for example, 2.5 V) VCLH similar to that at a time of burn-in is applied as the power supply potential VCL from the external portion. At the time of the writing operation, a high power supply boost voltage VPPH of, for example, 4.2 V, in which the high power supply potential VCLH is boosted, is applied to the control terminal CG and the source terminal SL of the writing circuit 241 of the EPROM cell EC. If the write data is at "0", the high power supply voltage VCLH of, for example, 2.5 V is applied to the write data terminal PRG. If the write data is at "1", the ground voltage VSS is applied.

Also, at the time of the writing operation, in the reading circuit 242, the control signals PSG, PUS and PU are set to a high level. Thus, the MOSFETs Tr2, Tr1 are turned on, and the MOSFET Tr1 is turned off. Hence, the source terminals and the drain terminals of the MOSFET Mer0, Mer1 are fixed at the ground potential, and they become at an inactive state.

If the ground voltage VSS is applied to the write data terminal PRG (if the write data is at "1", the potential difference between the write data terminal PRG and the source terminal SL is relatively large. Thus, electrons are accelerated, which causes currents to flow between the sources and the drains of the Mep0, Mep1. Thus, hot carriers are implanted into the floating gates Fg0, Fg1. Hence, if the write data of "1" is programmed, the potentials of the floating gates Fg0, Fg1 become at −VPPH (for example, −4.2 V). Consequently, the MOSFETs Mep0, Mep1, Mer0 and Mer1 are set at the states that the threshold values are high.

Also, if the high power supply voltage VCLH is applied to the write data terminal PRG (if the write data is at "0"), the potential difference between the write data terminal PRG and the source terminal SL is relatively small. Thus, the electrons are not sufficiently accelerated, which disables the currents to sufficiently flow between the sources and the drains of the Mep0, Mep1. Hence, the hot carriers are not implanted into the floating gates Fg0, Fg1.

The erasing operation of the EPROM cell EC will be described below with reference to FIGS. 7A to 7F.

At the time of the erasing operation, the high power supply voltage (for example, 2.5 V) VCLH is applied as the power supply voltage VCL from the external portion. At the time of the erasing operation, the high power supply boost voltage VPPH is applied to the source terminal SL of the writing circuit 241, the ground voltage VSS is applied to the control terminal CC, and the high power supply voltage VCLH is applied to the write data terminal PRG. Thus, the electrons accumulated in the floating gates Fg0, Fg1 are drawn through the gate insulation films of the MOSFETs Mep0, Mep1 into the side of the source terminal SL, by tunnel phenomenon. Hence, the threshold values of the MOSFETs Mep0, Mep1, Mer0 and Mer1 are set to the low states.

Also, at the time of the erasing operation, in the reading circuit 242, the control signals PSG, PUS and PU are set to the high levels. Thus, the MOSFETs Tr2, Tr0 are turned on, and the MOSFET Tr1 is turned off. The source and drain terminals of the MOSFETs Mer0, Mer1 are fixed to the ground potential, and they are set to the inactive states.

The reading operation of the EPROM cell EC will be described below with reference to FIGS. 8A to 8F.

At the time of the reading operation, the normal power supply voltage (for example, 1.8 V) VCL is applied as the power supply voltage VCL from the external portion. At the time of the reading operation, the ground potential is applied to the source terminal SL and the write data terminal PRG of the writing circuit 241, and the normal power supply voltage VCL is applied to the control terminal CG.

Also, at the time of the reading operation, in the reading circuit 242, the control signal PU is firstly changed to the low level. In the condition that the MOSFET Tr0 is turned off, a negative control pulse PUS is applied, the MOSFET Tr1 is turned on, and the node N2 is pre-charged. Finally, a positive control pulse PSG (Pass Gate) is applied. Thus, the MOSFET Tr2 is turned on.

At the time of the reading operation, when the normal power supply voltage VCL is applied to the control terminal CG, if the hot carriers are implanted into the floating gates Fg0, Fg1 (if the write data "1" is programmed), the threshold value is high. Thus, currents do not flow through the MOSFETs Mer0, Mer1. As a result, the potential of the node N2 is kept at VCL, and the data at the VCL is outputted to the latch 240.

On the other hand, at this time, if the hot carriers are not implanted into the floating gates Fg0, Fg1 (if the write data "0" is programmed), the threshold value is low. Thus, the currents flow through the MOSFETs Mer0, Mer1. As a result, the potential of the node N2 is dropped to the ground potential, and the data at the ground level is outputted to the latch 240.

As mentioned above, when the write data "1" is programmed in the EPROM cell EC, the potentials of the floating gates Fg0, Fg1 are dropped to −VPPH. However, since the floating gates Fg0, Fg1 are constituted by the wirings (the poly-silicon wirings), their potentials are leaked, which may cause them to be changed from −VPPH to the potential close to 0 V. In this way, the change of the threshold value deteriorates the reliability of the data.

When the accumulation charge retaining property is evaluated, if the threshold values of the floating gates Fg0, Fg1 are read, it is enough to control the potentials applied to the MOSFETs Mg0, Mg1. That is, as illustrated in the bottom column of FIG. 5, the potential of the control terminal CG is supplied from the external portion. Thus, the assignment of any voltage enables the threshold value of the cell transistor to be read at an excellent accuracy.

The method of verifying the EPROM cell EC, in the first defective address setting & comparing circuit 20A of FIG. 2, is as follows. The normal power supply potential VCL is applied to the control terminal CG. Then, while the address is scanned, the data of the memory array 11 is read out and compared with the expectation value data and judged to thereby generate FBM. Next, a voltage from the external portion is applied to the control terminal CG. Then, while the address is scanned, the FBM is similarly generated. If the comparison between both of them results in the coincidence, they are at OK, and if the comparison results in the non-coincidence, they are at NG. That is, the verification operation is done depending on whether or not the data of the memory array 11 can be correctly written/read out when the different potential is applied to the control terminal CG.

Figure 3:
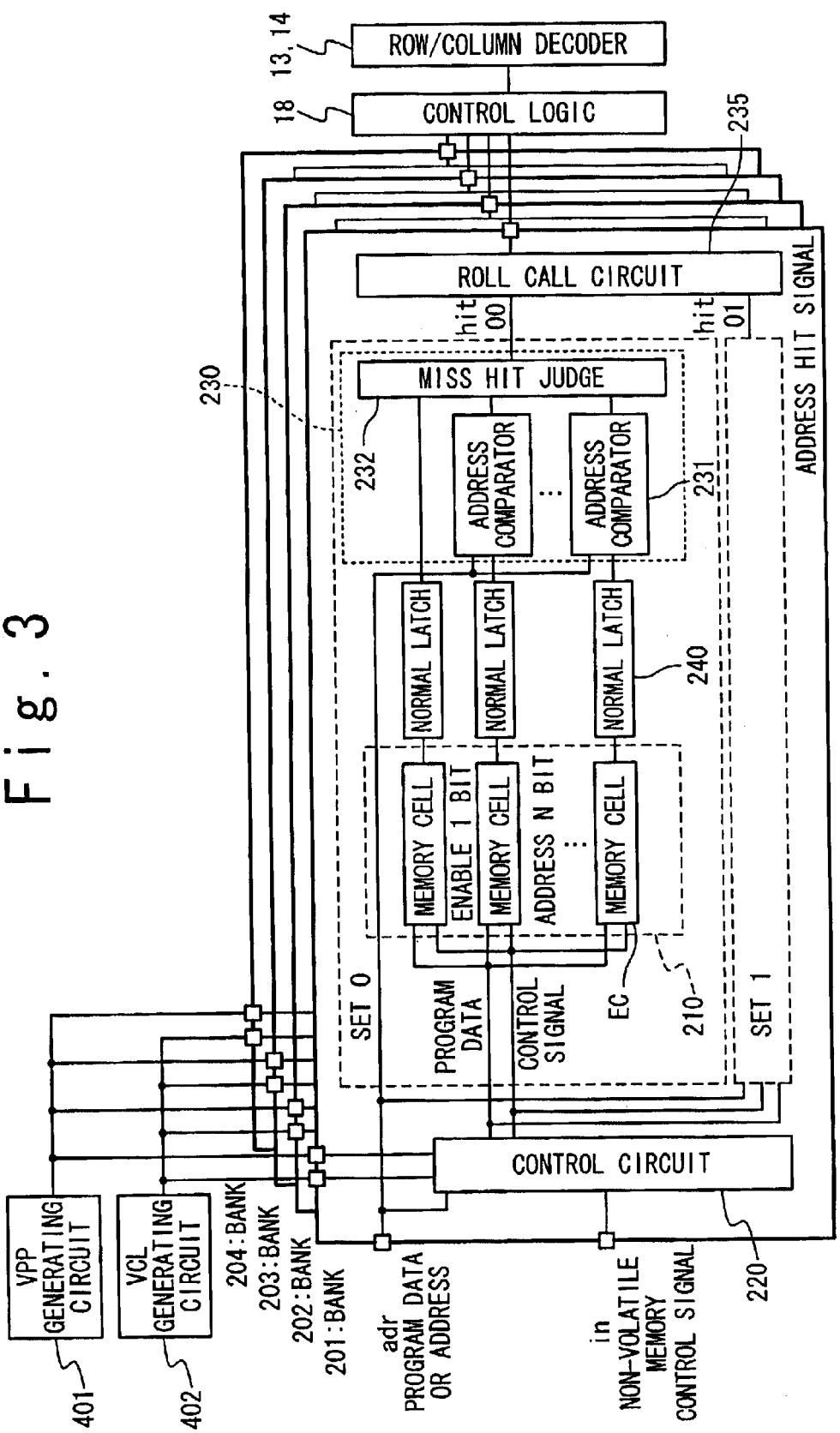
FIG. 3 is a block diagram showing a configuration example of a first defect address setting & comparing circuit in FIG. 2.

The configuration of FIGS. 3, 4 controls the control terminal CG from a test PAD (the PAD especially mounted on its wafer for the test) (it is shown as an external application in FIG. 5). Thus, it is impossible to evaluate the reliability of the EPROM cell EC after it is assembled. The evaluation is only the evaluation through sampling at the wafer situation.

Also, according to the above-mentioned method, in order to read out the information of the memory array 11, each time the voltage to be applied to the control terminal CG is set to the value of the voltage supplied from the power supply voltage VCL or the external terminal, it is necessary to carry out the address scan one time for each of the writing operation and the reading operation. Thus, the evaluation time becomes longer.

The object of this embodiment is to solve the above-mentioned problems.

The object of this embodiment is to provide the semiconductor integrated circuit apparatus, in which the potential of the CG terminal can be controlled from the outer terminal of the chip, so as to sufficiently evaluate the reliability of the EPROM cell EC (the non-destructive module, the non-volatile memory) after it is assembled.

This embodiment is designed so as to add a verification mode as the test mode in order to evaluate the accumulation charge retaining property of the floating gates Fg0, Fg1. As its configuration, the low call circuit sends the address hit signal to the data input output circuit 19, and applies the power supply potential VCL and the boosted potential VPP to the control terminal CG and then reads out the address content of the EPROM cell EC at each of the potentials. The voltage VPP is the boost voltage in which the normal power supply voltage VCL within the semiconductor memory is boosted.

A first embodiment will be described below. By the way, this embodiment is described by exemplifying the EPROM cell EC in which the CMOS manufacturing process can be used in its original state, similarly to FIG. 4.

The technique that can use the CMOS manufacturing process in its original state, such as the EPROM cell EC of FIG. 4, is noted in a treatise under a title, [CMOS Process Compatible ie-Flash (inverse gate electrode Flash) Technology for System-on-a Chip] written by Shoji SHUKURI, Kazumasa YANAGAWA et al. (IEICE Transaction on Electrons (Communication Society English Report) Vol E84-C, No 6 (p734) June 2001.

This embodiment is described by exemplifying the EPROM cell EC. However, this embodiment can be applied to even a flash memory.

The first embodiment will be described below with reference to FIG. 9.

As shown in FIG. 10, the operation mode of "Verification" is added to the state of the EPROM cell EC controlled by the control signal outputted from the control circuit 220 (refer to FIG. 5).

The decoder for decoding the input command from the external test apparatus is installed in the control circuit 220, in order to determine the voltage applied to each of the terminals of the non-volatile memory array 210 (the EPROM cell EC of FIG. 9), corresponding to the respective operations (the program "0", the program "1", the erasing, the reading, the standby and the verification) of the table shown in FIG. 10.

In the configurations of FIGS. 3, 4, any voltage is applied to the control terminal CG from the test PAD, at the time of the verification operation mode. For this reason, the threshold value of the cell transistor can be measured at the excellent accuracy. However, since the PAD can not be pulled out after it is assembled, this has a fault that the threshold value of the cell transistor can not be measured. On the contrary, in this embodiment, the normal power supply boost potential VPP (for example, 3.0 V, the boost voltage) higher than the normal power supply potential (for example, 1.8 V) VCL is applied from the control terminal CG. Thus, the threshold value of the cell transistor can be automatically measured even after it is assembled.

Immediately after the write data "1" is programmed, the potentials of the floating gates Fg0, Fg1 are at −VPPH (for example, −4.2 V, this VPPH indicates the high power supply boost voltage). However, in association with temporal elapse, the leak is induced. Their potentials Fg0, Fg1 are changed towards 0 V.

As shown in FIGS. 3 to 5, in the configuration in which only the VCL (for example, 1.8V, this VCL indicates the normal power supply voltage) is applied to the control terminal CG at the time of the reading operation, whether or not the programmed data is changed can not be judged, unless the potentials of the floating gates Fg0, Fg1 are changed from −VPPH (for example, −4.2 V, this VPPH indicates the high power supply boost voltage) to about −VCL (for example, −1.8 V, this VCL indicates the normal power supply voltage), namely, until the change of ΔV=2.4 V. Hence, this is not the effective evaluation method.

On the contrary, as shown in FIG. 10 in this embodiment, in the configuration in which the VPP (for example, 3.0 V, this VPP indicates the normal power supply boost voltage) is applied to the control terminal CG as the verification operation, whether or not the programmed data is changed can be judged, at the time when the potentials of the floating gates. Fg0, Fg1 are changed from −VPPH (for example, −4.2 V, this VPPH indicates the high power supply boost voltage) to about −VPP (for example, −3.0 V, this VPP indicates the normal power supply boost voltage) (in short, prior to the change of about −VCL (for example, −1.8 V, this VCL indicates the normal power supply voltage)), namely, by the change of ΔV=1.2 V.

In the first embodiment, the reliability can be sufficiently evaluated after the chip is sealed (assembled) in the package, by using the configurations of FIGS. 9, 11, 2, 4 and 10 and the fail bit map (FBM).

Figure 9:
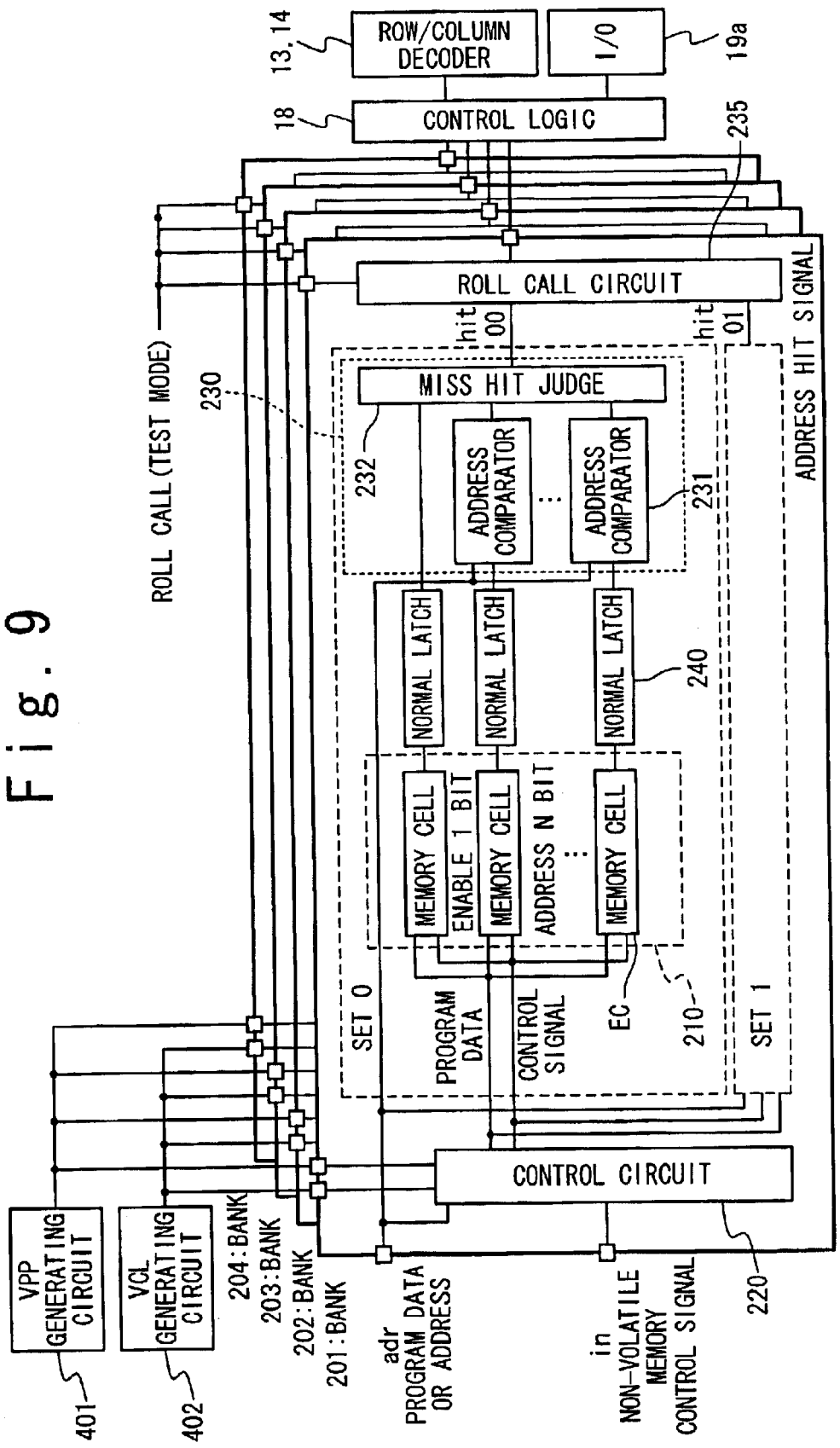
FIG. 9 is a block diagram showing a configuration of a first embodiment of a semiconductor integrated circuit apparatus in the present invention.
Figure 11:
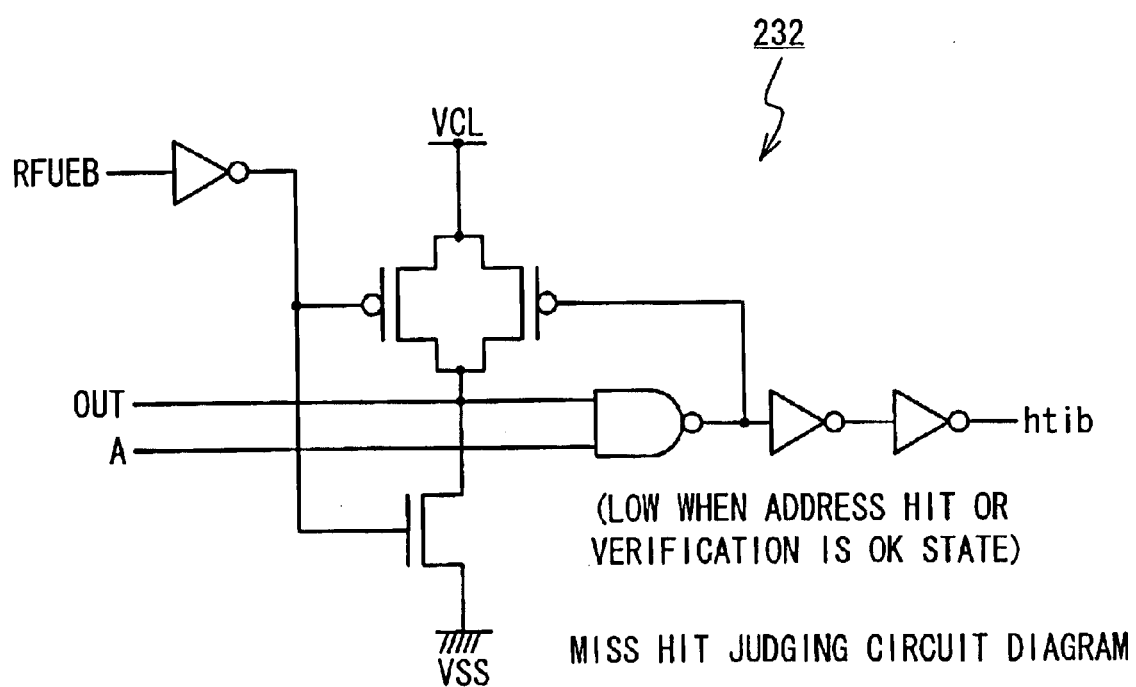
FIG. 11 is a circuit diagram showing a configuration of a miss hit judging unit of the first embodiment of the semiconductor integrated circuit apparatus in the present invention.

By the way, FIG. 11 shows the circuit configuration of the miss hit judging unit 232 in this embodiment (FIG. 9). However, the circuit configuration of the miss hit judging unit 232 of FIG. 3 is also similar to that of FIG. 11.

As shown in FIGS. 9, 3, the verification mode is added in FIG. 9. At the time of the verification mode, an output destination of the address hit signal hit is switched to an I/O buffer 19a so that the address hit signal hit is not outputted to the address decoders 13, 14. Then, the address hit or the state of the miss hit is directly outputted as the I/O data.

At first, as the verification mode, the normal power supply voltage VCL is applied to the control terminal CG, and the data of the EPROM cell EC is read out to the latch 240.

Next, a redundancy roll call is tested to then scan all bits (addresses). At this time, an external access address is inputted to the terminal adr of FIG. 9, and the external access address data and the data of the normal latch 240 are compared with each other by using the address comparator 231 and the miss hit judging unit 232. This compared result is outputted through the control circuit 18 and the I/O data buffer 19a to a DQ terminal by using a roll call circuit 235. The fail bit map (FBM) is generated on the basis of an output data indicative of a hit and a miss hit from the DQ terminal. The result of this FBM indicates the usage or the non-usage of the EPROM cell EC.

Next, the normal boost voltage VPP is applied to the control terminal CG, and the data of the EPROM cell EC is read out to the latch 240.

Next, the redundancy roll call is tested to scan all of the bits (addresses). At this time, the external access address is inputted to the terminal adr of FIG. 9, and the external access address data and the data of the normal latch 240 are compared with each other by using the address comparator 231 and the miss hit judging unit 232. This compared result is outputted through the control circuit 18 and the I/O data buffer 19a to the DQ terminal by using the roll call circuit 235. The fail bit map (FBM) is generated on the basis of the output data from the DQ terminal. The result of this FBM indicates the data (the usage or the non-usage of the EPROM cell EC) when the data of the EPROM cell EC is read out to the latch 240 by applying the normal boost voltage VPP.

Next, the fail bit map indicating the result read out at the normal power supply voltage VCL is compared with the fail bit map indicating the result read out at the normal boost voltage VPP. If they are the same result, the stored content of the EPROM cell EC is at OK. If they are the different result, it indicates that the stored consent of the EPROM cell EC is changed. Thus, the reliability of the EPROM cell EC can be evaluated in accordance with the compared result.

In the first embodiment, the order when the operation of the VCL application and the operation of the VPP application are done can be reversely carried out.

In the first embodiment, it is possible to sufficiently evaluate the reliability of the EPROM cell EC after it is assembled.

Also, in the first embodiment, the address scanning operation is done two times (one time for each of the VPP application and the VCL application), and the data is compared. Thus, the evaluation time is made shorter than that of the above-mentioned conventional application example.

A second embodiment will be described below with reference to FIG. 12.

Also in the second embodiment, the mechanism for carrying out the sufficient reliability evaluation of the EPROM cell EC after it is assembled, in accordance with the compared result between the data read out when the normal power supply voltage VCL is applied to the control terminal CG and the data read out when the normal boost voltage VPP is applied to the control terminal CG is similar to the first embodiment.

Figure 12:
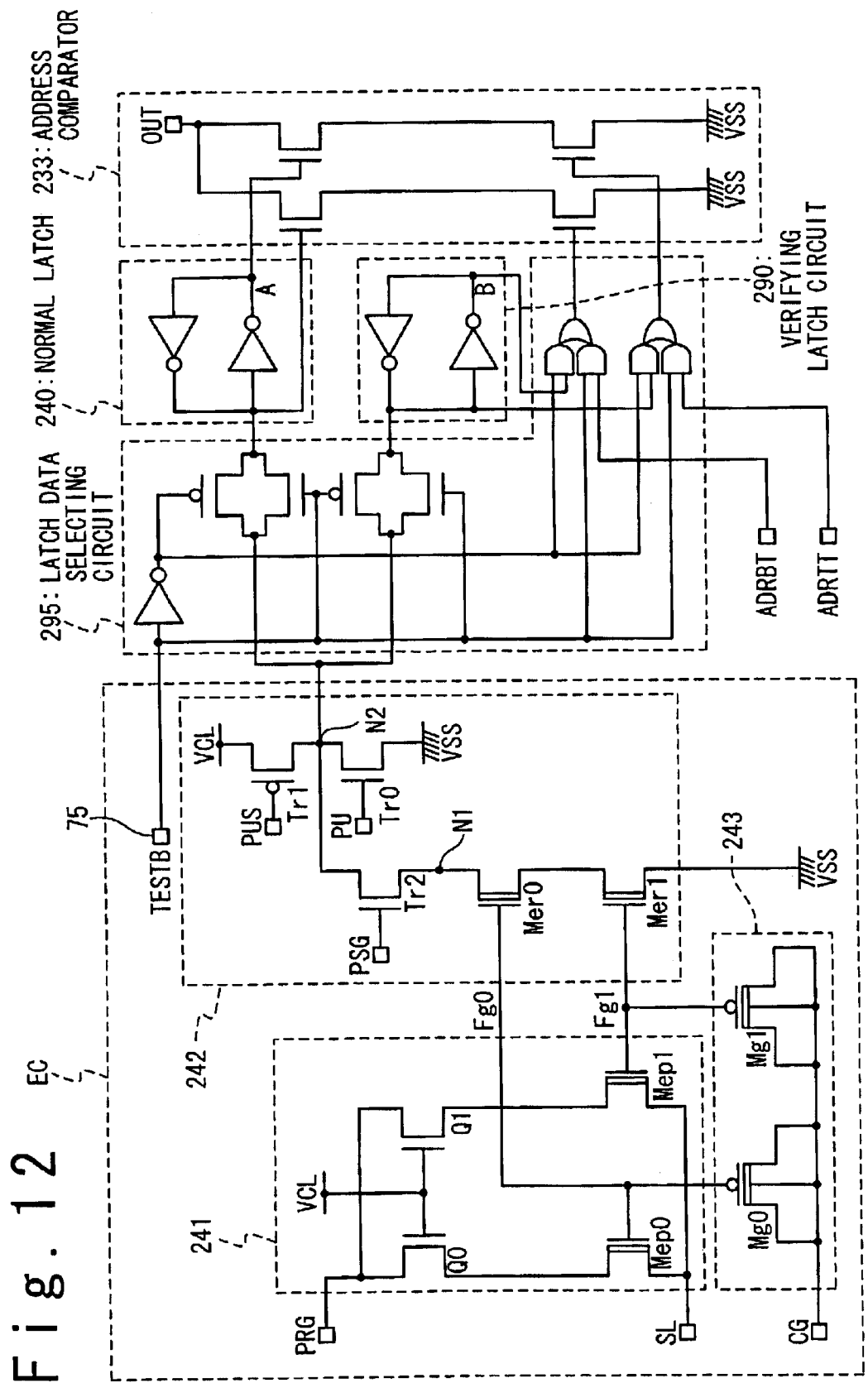
FIG. 12 is a block diagram showing a configuration of an EPROM cell EC and its peripheral configuration of a second embodiment of the semiconductor integrated circuit apparatus in the present invention.

As shown in FIG. 12, in this embodiment, a verifying latch circuit 290 and a latch data selecting circuit 295 are added, as compared with the configuration of FIG. 4. The latch data selecting circuit 295 selects whether the output destination of the data of the node N2 is the normal latch 240 (equal to the latch 240 of FIG. 4) or the verifying latch circuit 290.

At the time of the verification operation, at first, the reading operation (the normal power supply voltage VCL is applied to the control terminal CG) of the normal power supply voltage (for example, 1.8 V) VCL is done, and a high signal is inputted to a TESTB terminal 75, and the data of the node N2 is outputted to the normal latch 240.

Next, the normal power supply boost potential (for example, 3.0 V) VPP is applied to the control terminal CG, a low signal is inputted to the TESTB terminal 75, and the data of the node N2 is outputted to the verifying latch circuit 290.

The address comparator 233 compares the data outputted from the normal latch 240 with the data outputted from the verifying latch circuit 290. As the compared result, the occurrence of the non-coincidence between the data indicates the progress of the leakage of the potentials of the floating gates Fg0, Fg1, which indicates that there is the problem in the reliability of the data. That is, the comparison between the latched result in the reading operation and the latched result at the time of the verification leads to the hit miss judgment in its original state. Thus, it is possible to carry out the verification operation in the short evaluation time without scanning the address.

When the address comparator 233 compares the data outputted from the normal latch 240 with the data outputted from the verifying latch circuit 290, if they coincide with each other as the compared result, it is known that the potentials of the floating gates Fg0, Fg1 are not changed from −VPPH (for example, −4.2 V, this VPPH indicate the high power supply boost voltage) to −VPP (for example, −3.0 V, this VPP indicates the normal power supply boost voltage). In this case, that EPROM cell EC is judged as a pass.

Figure 13:
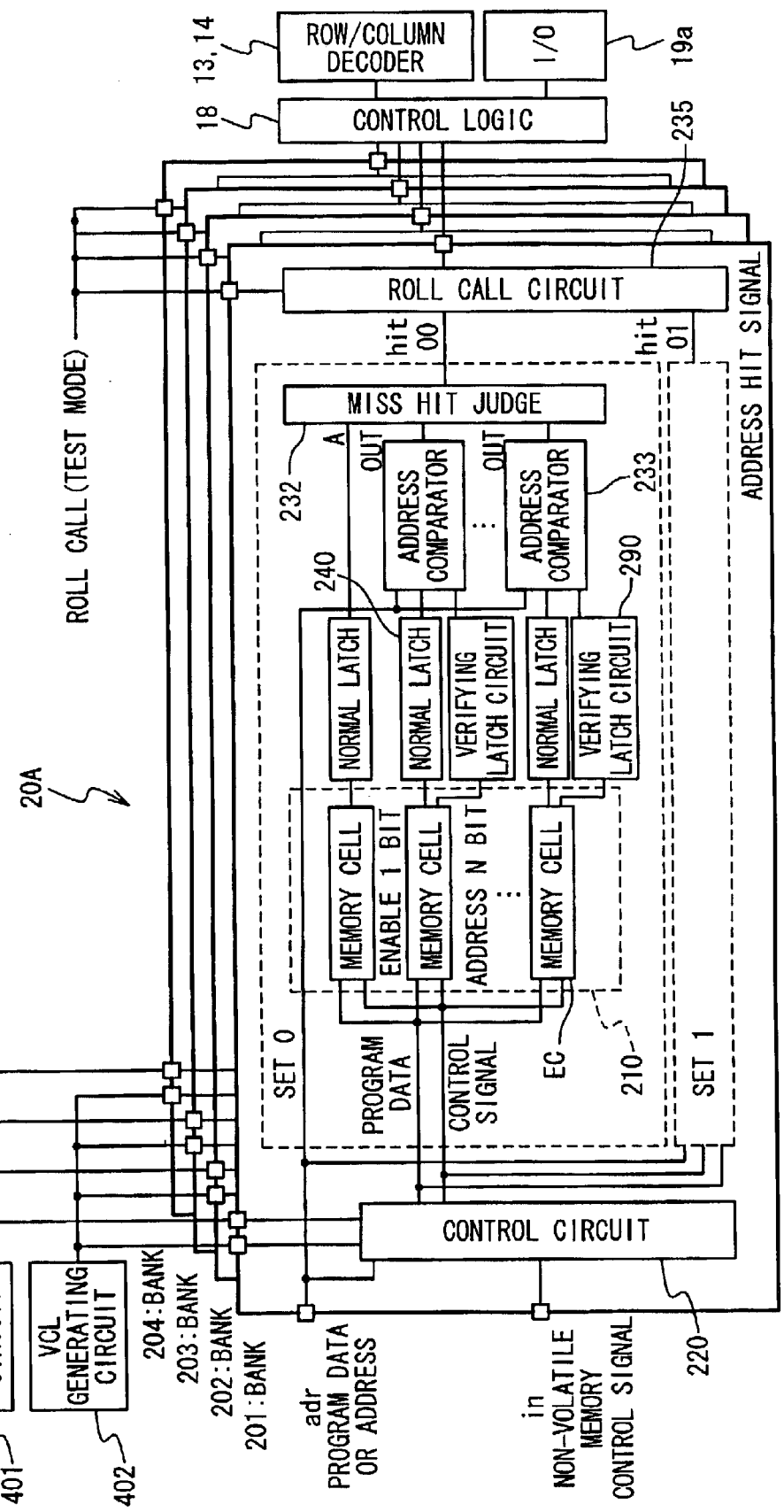
FIG. 13 is a block diagram showing a configuration example of a first defect address setting & comparing circuit of the second embodiment of the semiconductor integrated circuit apparatus in the present invention.

The output data of the address comparator 233 (indicating the result of the comparison between the data outputted from the normal latch 240 and the data outputted from the verifying latch circuit 290) is outputted through the roll call circuit 235 to the DQ terminal. As shown in FIG. 13, the roll call circuit 235 can output the result of the verification test to the DQ terminal by inputting the test mode of the roll call at the time of the verification.

Also, the address comparator 233 has the function of comparing one bit of the defective address stored in the non-volatile memory array 210 with one bit of the DRAM access address, similarly to the address comparator 231 of FIGS. 3, 4.

By the way, the normal power supply boost voltage VPP applied to the control terminal CG at the time of the verification is not always optimal as the potential used in the verification. However, this voltage is the effective value since the fact that the potentials of the floating gates Fg0, Fg1 pass through the middle point (for example, −3.0 V) between −VPPH (for example, −4.2 V, this VPPH indicates the high power supply boost voltage) and −VCL (for example, −1.8 V, this VCL indicates the normal power supply voltage) can be detected.

The voltage applied to the control terminal CG at the time of the verification can be easily set by changing the power supply voltage VCL at the time of the verification. For example, if the high power supply voltage VCLH at the time of the programming is 2.5 V similar to the above-mentioned example, the potentials of the floating gates Fg0, Fg1 are −4.2 (—VPPH:—(high power supply boost voltage)) V. Moreover, if the power supply voltage VCL at the time of the verification is assumed to be 2.4 V instead of 1.8 V of the above-mentioned example, the boost voltage VPP in which the power supply voltage (2.4 V) VCL is boosted therein becomes about 4.0 V. The change amount of the difference of 0.2 V can be detected.

Also, in the conventional test mode, there is a test signal for controlling so as to trim the potential VPP (adjust the potential VPP by trimming a load resistance and changing the load resistance). Thus, if it is used, the value in which the potential VPP is slightly increased or decreased can be applied to the control terminal CG. That is, in a case of a combination with a known trimming test of a word line boost voltage VPP, the screening standard of the accumulation charge retaining property can be controlled within a trimming voltage range.

The control circuit 220 includes the decoder for decoding the command received from the external test apparatus, in order to determine the voltage given to each terminal of the non-volatile memory array 210 (the EPROM cell EC of FIG. 9), correspondingly to each of the operations (the program "0", the program "1", the erasing, the reading, the standby and the verification) in the table of FIG. 10.

The operation example of this embodiment using the VPP trimming as the application of the second embodiment will be described below with reference to FIGS. 12, 13 and 14A to 14O.

In the example of FIGS. 14A to 14O, the defective address is assumed to be already programmed in the non-volatile memory array 210.

As the verification operation, at first, as illustrated by ① of FIG. 14B, a normal MRS (for example, a reading) command is executed, and a data of the EPROM cell EC is read out to the normal latch 240.

Next, as illustrated by ② of FIG. 14B, "Test Mode of VPP Trimming" is executed. This command enables the voltage of the control terminal CG at the time of the verification reading operation to be set (VPP±0.1 V). In short, it is possible to set the screening standard.

Next, as illustrated by ③ of FIG. 14B, "Test Mode of Verification (Narrow Definition: this is referred to as a narrow definition because of the meaning different from the above-mentioned definition)" is executed. A TESTB signal is activated, a verifying latch 290 is selected, and the voltage set in the item ② (the potential VPP if the item ② is not done) is applied to the control terminal CG. Then, the data of the EPROM cell EC is read out to the verifying latch 290.

Next, as illustrated by ④ of FIG. 14O, the address comparator 233 compares the normal latch 240 with the data of the verifying latch circuit 290. If both of them coincide with each other as the compared result, an output signal OUT from the address comparator 233 becomes low. If they do not coincide, the output signal OUT becomes high. Although it is not shown in FIGS. 14A to 14O, if the miss hit judging unit 232 of FIG. 13 receives even only one high output signal OUT from the address (a set unit), an output signal hitb (refer to FIG. 11) of the miss hit judging unit 232 becomes high.

Next, as illustrated by ⑤ of FIG. 14B, "Test of Redundancy Roll Call" is executed, and the result of the verification test is read out to the DQ terminal. If the high signal is outputted from the DQ terminal, this case implies that the change in the potentials of the floating gates Fg0, Fg1 is large and the reliability of the data is poor. On the other hand, if the low signal is outputted from the DQ terminal, this case implies that the normal latch 240 coincides with the data of the verifying latch circuit 290, and the reliability of the data is excellent.

Next, as illustrated by ⑥ of FIG. 14B, "Release of Test Mode" is executed, and the verification test is ended.

According to the above-mentioned configurations of FIGS. 12, 13 in this embodiment, the verification test can be carried out at a time (a high speed) of several tens of cycles, as shown in FIGS. 14A to 14O.

By the way, according to the second embodiment, if the roll call circuit 235 is used, the reliability of the EPROM cell EC of one bit can be quickly evaluated without using the FBM and without scanning all of the bits (addresses), differently from the first embodiment. On the contrary, in the configuration of FIG. 9 in the first embodiment, even if the roll call circuit is used, it is necessary to scan all of the bits.

As mentioned above, this embodiment can provide the following effects.

(1) The combination with the existing tests suppresses the increase in the chip area.
(1-1) The voltage used at the time of the verification mode can be shared with the word line boost voltage.
(1-2) The determination of the screening standard can be shared with the trimming test of the boost voltage.
(1-3) The circuit at the time of the verification check can be shared with a part of the redundancy relieving circuit.
(1-4) The circuit for reading out the result of the verification test can be shared with the redundancy roll call test.
(2) Due to the above-mentioned items (1), the reliability of the semiconductor memory is improved.

According to the method of verifying the semiconductor integrated circuit apparatus in the present invention, it is possible to sufficiently evaluate the reliability of the non-destructive fuse module after it is assembled.

What is claimed is:

1. A method of verifying a semiconductor integrated circuit apparatus, comprising:
   (a) providing a semiconductor integrated circuit apparatus including: a first transistor which has a floating gate in which a potential is floated and to which data is written; a second transistor which has a floating gate connected together with said floating gate and reads out said data written to said first transistor; and a control gate unit, which is coupled to said floating gate, controlling an operation of reading out said data of said second transistor;
   (b) comparing a first data outputted through said second transistor when a first potential is applied to said control gate unit with a second data outputted through said second transistor when a second potential is applied to said control gate unit to generate a comparison result; and
   (c) verifying said data written to said floating gate based on said comparison result, and
   wherein said first potential is different from said second potential.

2. The method of verifying a semiconductor integrated circuit apparatus according to claim 1, wherein said first potential is a potential supplied from an external portion to said semiconductor integrated circuit apparatus when said data is read out, and
   wherein said second potential is a potential generated by boosting said first potential in said semiconductor integrated circuit apparatus.

3. The method of verifying a semiconductor integrated circuit apparatus according to claim 1, wherein at said (b), said first data latched by a first latching circuit is compared with said second data latched by a second latching circuit.

4. The method of verifying a semiconductor integrated circuit apparatus according to claim 1, wherein at said (b), said second potential that is trimmed is applied to said control gate unit.

5. The method of verifying a semiconductor integrated circuit apparatus according to claim 1, wherein at said (b), said second potential is higher than or equal to a potential which is supplied from an external portion to said semiconductor integrated circuit apparatus when said data is read out, and is lower than or equal to a boost potential in which a potential supplied from said external portion to said semiconductor integrated circuit apparatus when said data is programmed, is boosted.

6. A semiconductor integrated circuit apparatus, comprising:
   a first transistor which has a floating gate in which a potential is floated and to which data is written;
   a second transistor which has a floating gate connected together with said floating gate and reads out said data written to said first transistor; and
   a control gate unit which is coupled to said floating gate and controls an operation of reading out said data of said second transistor, and
   wherein a verifying operation of said data written to said floating gate is performed based on a comparison result of comparing a first data outputted through said second transistor when a first potential is applied to said control gate unit with a second data outputted through said second transistor when a second potential is applied to said control gate unit, and
   wherein said first potential is different from said second potential.

7. The semiconductor integrated circuit apparatus according to claim 6, further comprising:
   a second latch circuit latching said second data.

8. The semiconductor integrated circuit apparatus according to claim 6, wherein said second potential that is trimmed is applied to said control gate unit.

9. The semiconductor integrated circuit apparatus according to claim 6, wherein said first potential is supplied to said semiconductor integrated circuit apparatus from an external portion, and said second potential is generated in said semiconductor integrated circuit apparatus.

10. The semiconductor integrated circuit apparatus according to claim 6, wherein said first potential is a potential supplied from an external portion to said semiconductor integrated circuit apparatus when said data is read out.

11. The semiconductor integrated circuit apparatus according to claim 6, wherein said second potential is a potential generated by boosting said first potential in said semiconductor integrated circuit apparatus.

12. The semiconductor integrated circuit apparatus according to claim 6, wherein said first potential is a potential applied to said control gate unit when said data is read out.

13. The semiconductor integrated circuit apparatus according to claim 6, wherein said second potential is a potential generated by boosting in said semiconductor integrated circuit apparatus a third potential supplied from an external portion to said semiconductor integrated circuit apparatus when said verifying operation is performed.

14. The semiconductor integrated circuit apparatus according to claim 13, wherein said third potential is different from said first potential.

15. The semiconductor integrated circuit apparatus according to claim 6, wherein said second potential is lower than a fourth potential generated by boosting in said semiconductor integrated circuit apparatus a fifth potential supplied from an external portion to said semiconductor integrated circuit apparatus when said data is written.

16. The semiconductor integrated circuit apparatus according to claim 6, wherein said second potential is lower than a sixth potential applied to said control gate unit when said data is written.

17. The semiconductor integrated circuit apparatus according to claim 6, wherein a first electrode of said first transistor is connected to a data input terminal to which said data is inputted, and wherein when said data is written to said first transistor, a seventh potential different from each of said first potential and said second potential is applied to a second electrode of said first transistor.

18. The semiconductor integrated circuit apparatus according to claim 6, wherein each of said first transistor, said second transistor and said control gate unit is constituted by a high withstanding voltage MOS transistor having a single gate structure, and wherein said first transistor, said second transistor and said control gate unit are formed in structures which can be manufactured by a CMOS manufacturing process.

19. The semiconductor integrated circuit apparatus according to claim 6, wherein a defective address data indicating a defective address of a DRAM is written to said semiconductor integrated circuit apparatus as said data, and wherein said second potential is a word line boost potential of said DRAM.

20. The semiconductor integrated circuit apparatus according to claim 19, wherein a comparison said first data with said second data is performed in an address comparator comparing said defective address with an input address which is used to access said DRAM.

21. The semiconductor integrated circuit apparatus according to claim 19, wherein a first signal indicating a result of a comparison said first data with said second data is outputted from a redundancy roll call circuit to output a second signal indicating said defective address which is relieved after said semiconductor integrated circuit apparatus is assembled to an external portion of said semiconductor integrated circuit apparatus.

22. The semiconductor integrated circuit apparatus according to claim 6, wherein said semiconductor integrated circuit apparatus is an EEPROM.

* * * * *